US012666558B2

(12) United States Patent
Yang et al.

(10) Patent No.: US 12,666,558 B2
(45) Date of Patent: Jun. 23, 2026

(54) ACCOMMODATING DEVICE AND DATA PROCESSING SYSTEM HAVING THE SAME

(71) Applicant: Fulian Precision Electronics (Tianjin) Co., LTD., Tianjin (CN)

(72) Inventors: Fang-Xing Yang, Tianjin (CN); Bin-Bin Yang, Tianjin (CN); Liang Gao, Tianjin (CN); Xing-Chuan Li, Tianjin (CN); Rui-Hao Xiao, Tianjin (CN)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 435 days.

(21) Appl. No.: 18/459,040

(22) Filed: Aug. 30, 2023

(65) Prior Publication Data

US 2024/0381559 A1 Nov. 14, 2024

(30) Foreign Application Priority Data

May 12, 2023 (CN) ......................... 202310538758.X

(51) Int. Cl.
*H05K 7/14* (2006.01)

(52) U.S. Cl.
CPC .................................. *H05K 7/1488* (2013.01)

(58) Field of Classification Search
None
See application file for complete search history.

(56) References Cited

U.S. PATENT DOCUMENTS

| | | | | |
|---|---|---|---|---|
| 7,978,463 B1 * | 7/2011 | Haun | ........................ | E04H 5/02 |
| | | | | 361/679.01 |
| 2011/0309097 A1 * | 12/2011 | Heilman | ............ | B65D 47/0871 |
| | | | | 220/326 |
| 2014/0106211 A1 * | 4/2014 | Lee | ..................... | H01M 50/262 |
| | | | | 429/185 |
| 2021/0198020 A1 * | 7/2021 | Farr | ........................ | A46B 17/02 |

FOREIGN PATENT DOCUMENTS

CN 214997062 U * 12/2021

* cited by examiner

*Primary Examiner* — James Wu
*Assistant Examiner* — Christopher L Augustin
(74) *Attorney, Agent, or Firm* — ScienBiziP, P.C.

(57) ABSTRACT

An accommodating device and a data processing system are provided. The device includes a housing defining a first opening, a cover assembly covering the first opening, a first sealing member, and a second sealing member. The cover assembly includes a first cover and a second cover. The housing includes a first side and a second side. The first cover is rotatably connected to the first side, and the second cover is rotatably connected to the second side. The first sealing member is between the cover assembly and the housing. The second sealing member is connected to the first or the second cover. When each of the first cover and the second cover covers the first opening, the first sealing member abuts against the housing and each of the first cover and the second cover, the second sealing member abuts against the first cover and the second cover.

18 Claims, 12 Drawing Sheets

30

31a    31a,                    32a    32a,
31                              32

ACCOMMODATING DEVICE AND DATA PROCESSING SYSTEM HAVING THE SAME

FIELD

The subject matter relates to servers, and more particularly, to an accommodating device and a data processing system having the accommodating device.

BACKGROUND

Electronic devices such as servers may be installed in a chassis. The chassis includes a housing and a cover for sealing the housing. During maintenance, the cover needs to be opened to expose the electronic device inside the chassis, which causes a waste of manpower and affects the efficiency. Furthermore, after the cover is opened, a medium (such as a coolant) inside the housing may flow out of the housing, which affects subsequent use of the electronic device.

Therefore, there is room for improvement in the art.

BRIEF DESCRIPTION OF THE DRAWINGS

Implementations of the present technology will now be described, by way of example only, with reference to the attached figures.

FIG. 4 is a diagrammatic view of a portion of the accommodating device in

FIG. 1.

DETAILED DESCRIPTION

Figure 1:
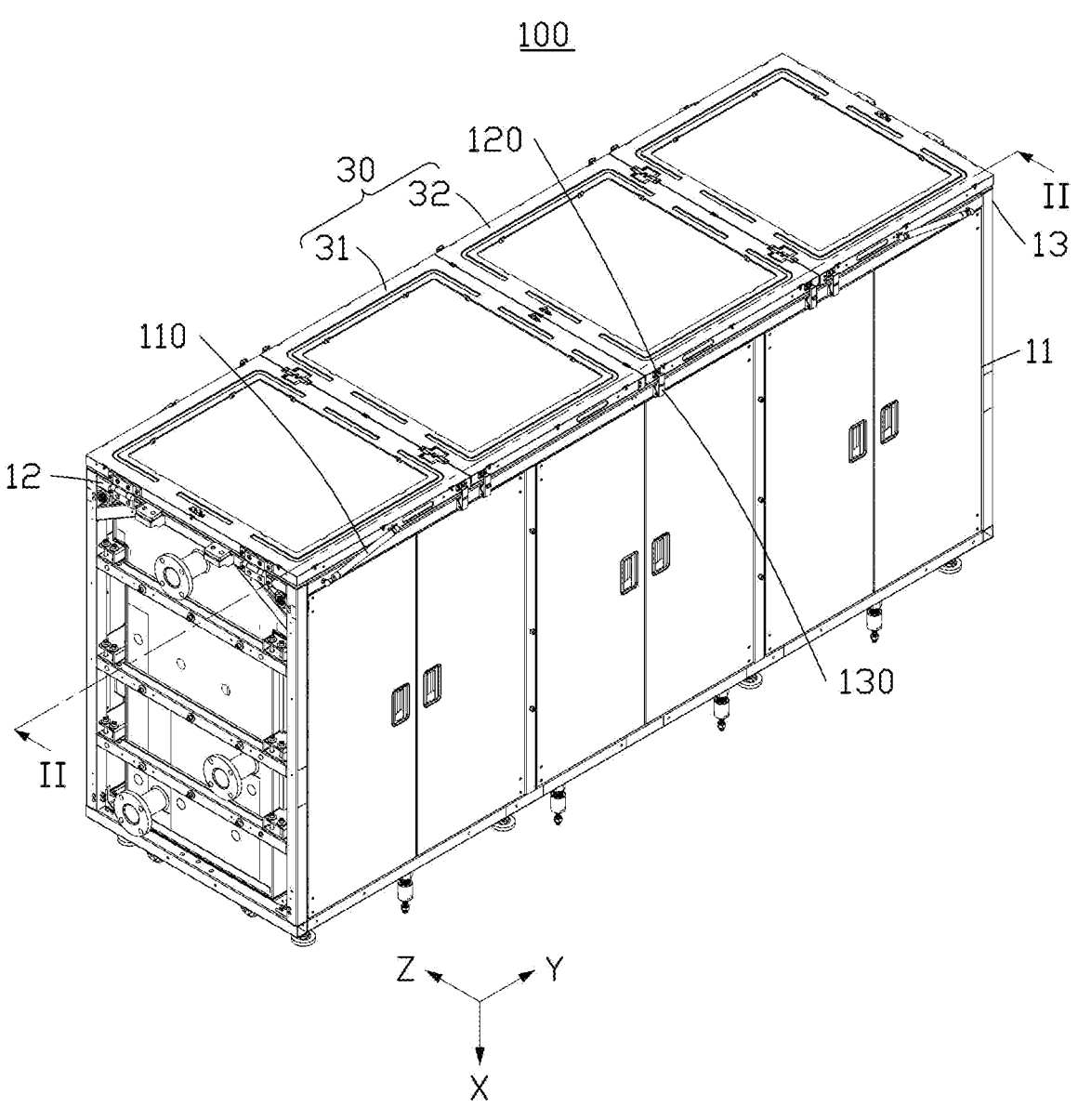
FIG. 1 is a diagrammatic view of an accommodating device according to an embodiment of the present application.

It will be appreciated that for simplicity and clarity of illustration, where appropriate, reference numerals have been repeated among the different figures to indicate corresponding or analogous members. In addition, numerous specific details are set forth in order to provide a thorough understanding of the embodiments described herein. However, it will be understood by those of ordinary skill in the art that the embodiments described herein can be practiced without these specific details. In other instances, methods, procedures, and members have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like.

Figure 2:
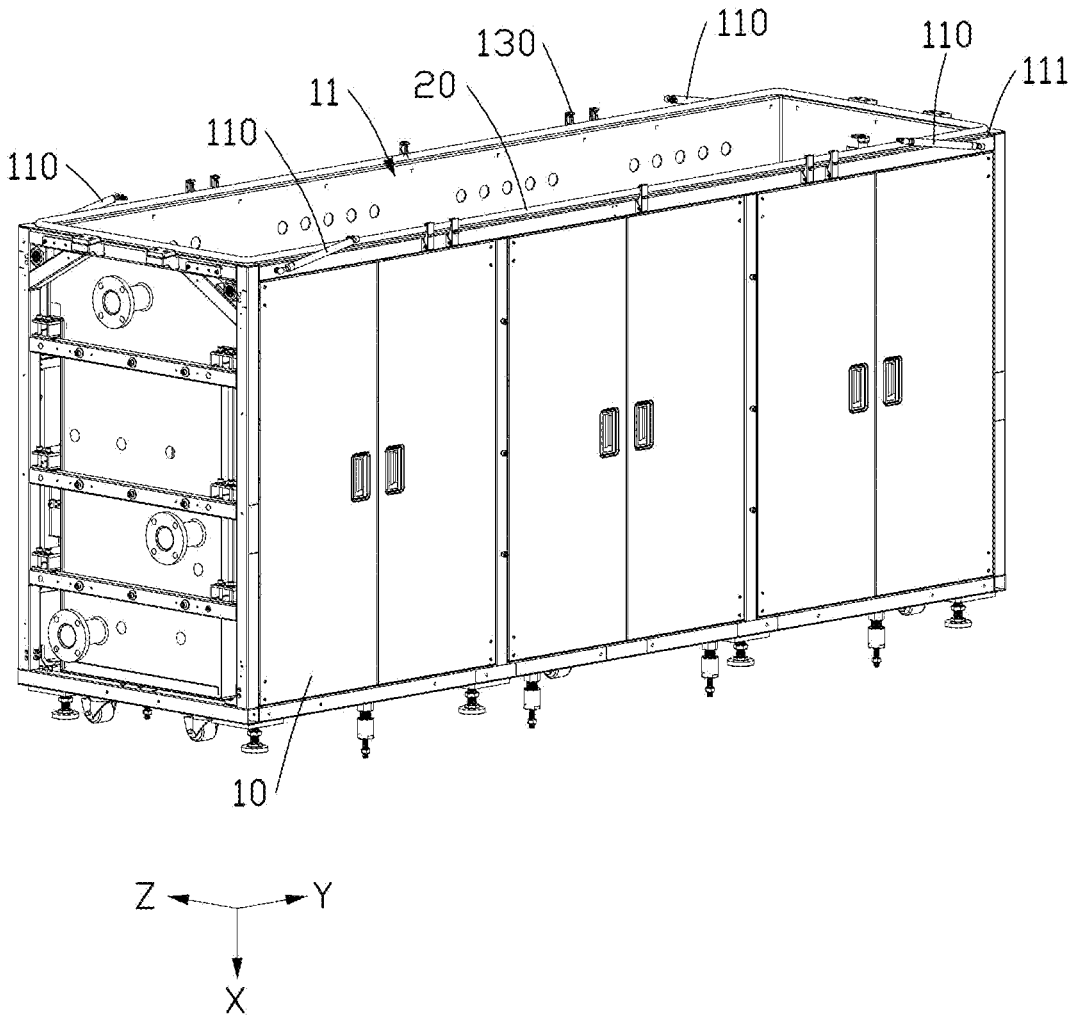
FIG. 2 is a diagrammatic view of a housing of the accommodating device in FIG. 1.

Referring to FIGS. 1 and 2, an accommodating device 100 is provided according to an embodiment of the present application. In at least one embodiment, the accommodating device 100 may be a chassis applied in a computer room. The accommodating device 100 includes a housing 10, a first sealing member 20, a cover assembly 30, and a second sealing member 40 (shown in FIG. 4). The housing 10 defines a first opening 11, and an electronic device (not shown) is placed into the housing 10 through the first opening 11. A medium (such as a coolant) may also be received in the housing 10 for dissipating the heat generated by the electronic device.

Figure 3A:
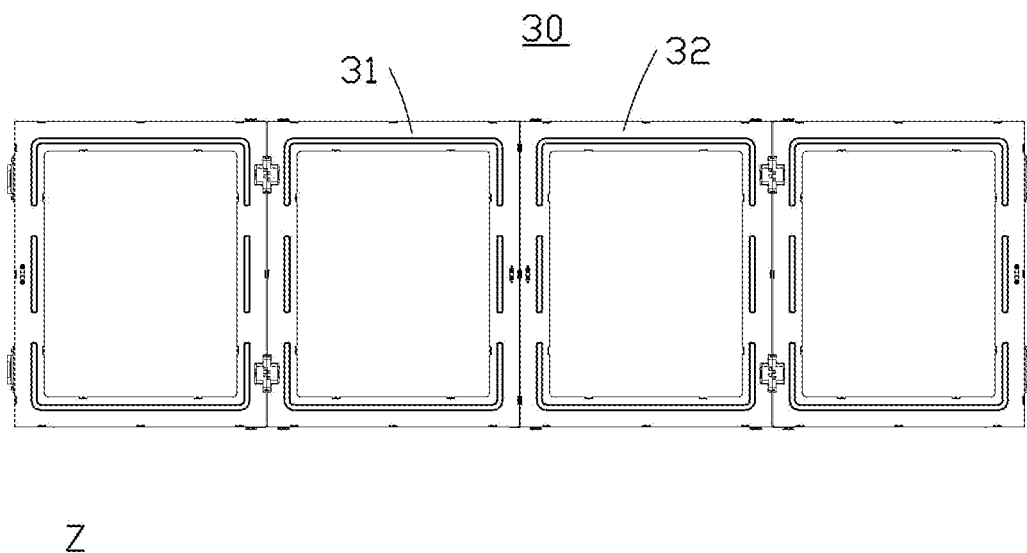
FIG. 3A is a diagrammatic view of a cover assembly of the accommodating device in FIG. 1.
Figure 3B:
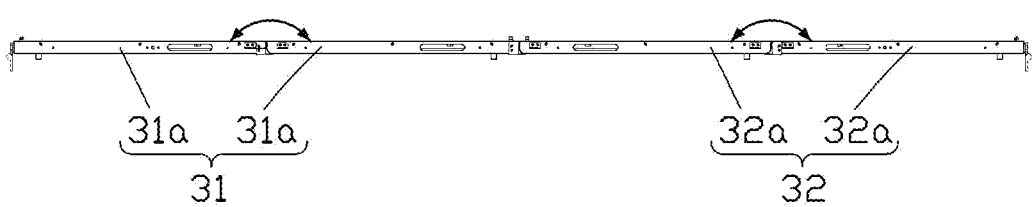
FIG. 3B is similar to FIG. 3A but illustrating the cover assembly from another angle.

The cover assembly 30 is used to cover the first opening 11. When the cover assembly 30 covers the first opening 11, the cover assembly 30 and the housing 10 are arranged in a first direction X. Referring to FIGS. 1, 3A, and 3B, the cover assembly 30 includes a first cover 31 and a second cover 32. When each of the first cover 31 and the second cover 32 covers the first opening 11, the first cover 31 and the second cover 32 are arranged in a second direction Y perpendicular to the first direction X. The housing 10 includes a first side 12 and a second side 13 opposite to the first side 12 in the second direction Y. An edge of the first cover 31 away from the second cover 32 is rotatably connected to the first side 12 of the housing 10. An edge of the second cover 32 away from the first cover 31 is rotatably connected to the second side 13 of the housing 10. In at least one embodiment, the first cover 31 is connected to the first side 12 through a hinge, and the second cover 32 is connected to the second side 13 through another hinge. When each of the first cover 31 and the second cover 32 covers the first opening 11, adjacent edges of the first cover 31 and the second cover 32 may be connected to each other such as by a fastener (not shown).

The housing 10 further includes an end surface 111 close to the first opening 11. The first sealing member 20 is located on the end surface 111. When each of the first cover 31 and the second cover 32 covers the first opening 11, the first sealing member 20 located between the housing 11 and each of the first cover 31 and the second cover 32 in the first direction X, and abuts against the housing 11 and each of the first cover 31 and the second cover 32. Thus, the first sealing member 20 can seal the space between the cover assembly 30 and the housing 10. The first sealing member 20 may be made of an elastic material, for example, rubber. In at least one embodiment, the end surface 111 is a surface of the housing 10 facing the first cover 31 and the second cover 32 in the first direction X. The end surface 111 can be used to install the first sealing member 20, and can also support the first cover 31 and the second cover 32.

Figure 4:
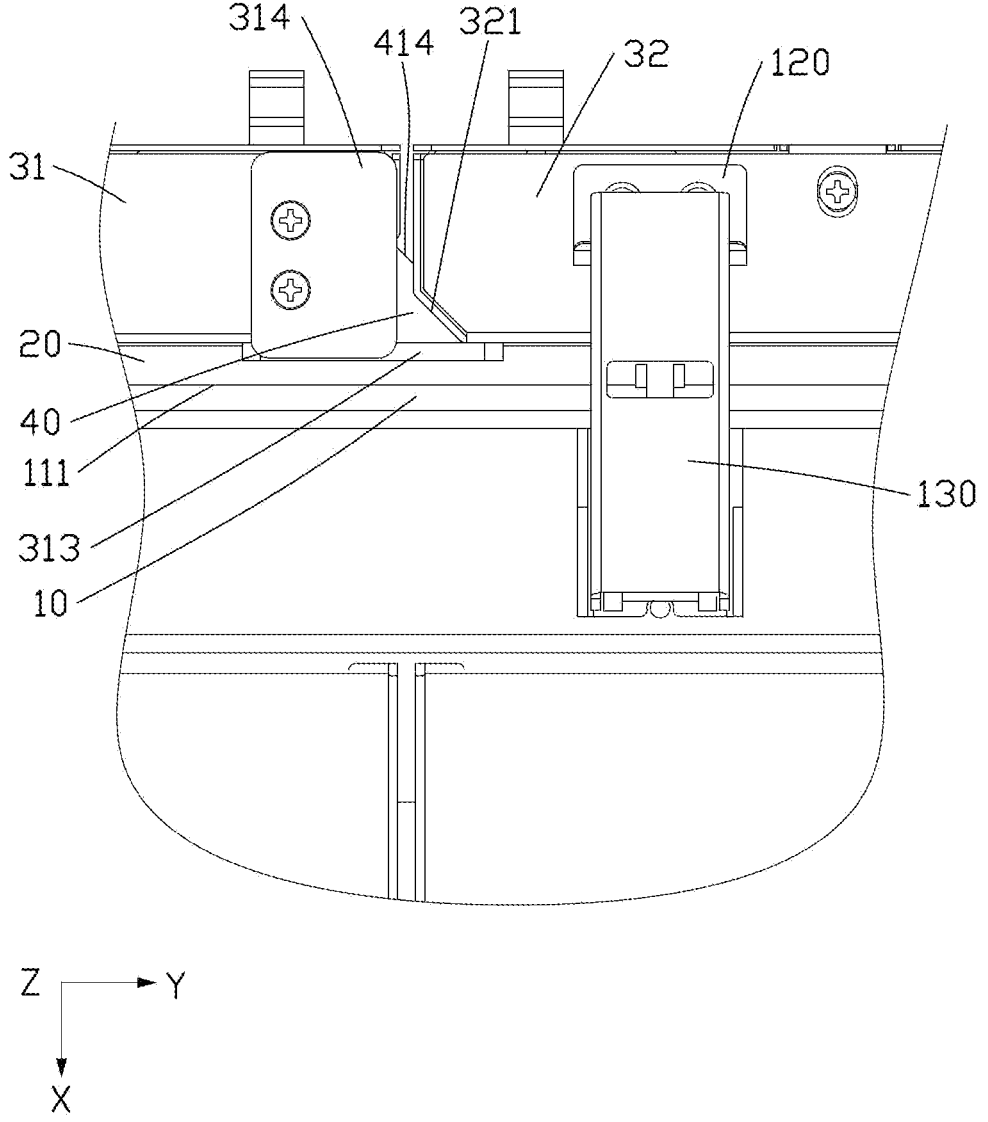
Figure 5:
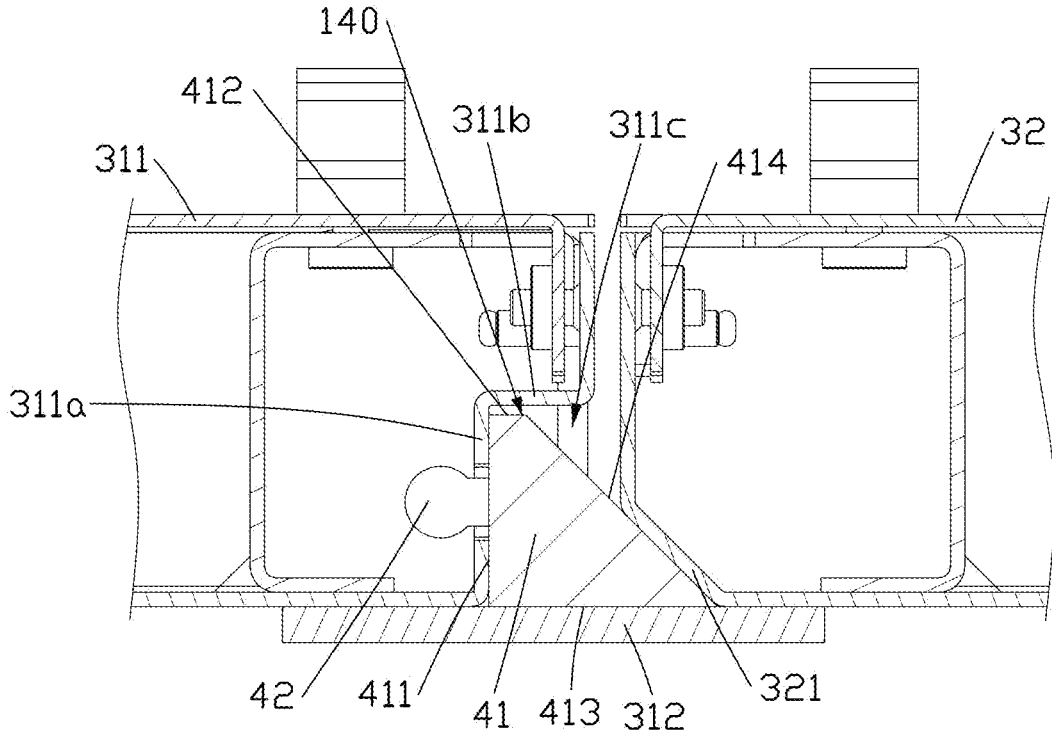
FIG. 5 is a cross-sectional view along II-II in FIG. 1.
Figure 5:
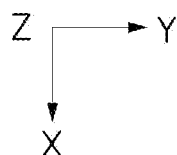

Referring to FIGS. 4 and 5, the second sealing member 40 is connected to the first cover 31 or the second cover 32. When each of the first cover 31 and the second cover 32 covers the first opening 11, the second sealing member 40 located between the first cover 31 and the second cover 32 in the second direction Y, and abuts against the first cover 31 and the second cover 32. The second sealing member 40 may be made of an elastic material, for example, rubber. The second sealing member 40 can seal the space between the first cover 31 and the second cover 32.

In the present application, the cover assembly 30 includes the first cover 31 and the second cover 32, and each of the first cover 31 and the second cover 32 is rotatably connected to the housing 10. Thus, at least one of the first cover 31 and the second cover 32 can be rotated to open the housing 10, thereby improving efficiency, facilitating the maintenance, and slowing down the speed of the medium that flowing out of the housing 10. The first sealing member 20 seals the space between the cover assembly 30 and the housing 10, and the second sealing member 40 seals the space between the first cover 31 and the second cover 32. Thus, the sealing effect of the accommodating device 100 can be improved.

In at least one embodiment, the accommodating device 100 further includes two operating members 110. An end of one of the operating members 110 is connected to the housing 10, and the other end of the operating member 110 is connected to the first cover 31, so that an operator can rotate the first cover 31 by the operating member 110. One end of another of the operating members 110 is connected to the housing 10, and the other end of the operating member 110 is connected to the second cover 32, so that the operator can rotate the second cover 32 by the operating member 110. In at least one embodiment, each of the operating members 110 may be a handle.

In at least one embodiment, the accommodating device 100 further includes two buckles 120 and two latches 130. One of the buckles 120 is fixed to the first cover 31, and another of the buckles 120 is fixed to the second cover 32. The latches 130 are fixed to the housing 10 and correspond to the buckles 120. When each of the first cover 31 and the second cover 32 covers the first opening 11, each of the latches 130 is engaged with a corresponding one of the buckles 120. The engagement between the latches 130 and the buckles 120 can press the cover assembly 30 to the housing 10 in the first direction X, thereby causing the first cover 31 and the second cover 32 to press against each of the first sealing member 20 and the second sealing member 40. Thus, the sealing effect of the accommodating device 100 can be improved.

Referring to FIGS. 4 and 5, in at least one embodiment, the first cover 31 includes a first main body 311. An edge of the first main body 311 away from the second cover 32 is rotatably connected to the first side 12 (shown in FIG. 1), and another edge of the first main body 311 close to the second cover 32 is provided with a first wall 311a and a second wall 311b. The second wall 311b protrudes from the first wall 311a in the second direction Y. The second wall 311b may be connected to the first wall 311a. The first wall 311a and the second wall 311b cooperatively form a recess 311c, and the second sealing member 40 is partially received in the recess 311c. The second sealing member 40 is connected to the first wall 311a.

In at least one embodiment, an edge of the second cover 32 close to the first cover 31 is provided with a pushing portion 321. The pushing portion 321 is inclined relative to the first direction X and the second direction Y. The pushing portion 321 may be an inclined wall. When the first cover 31 is connected to the second cover 32, the pushing portion 321 can press the second sealing member 40 in the first direction X and the second direction Y, so that the second sealing member 40 is compressed and abuts against the first main body 311 and the second cover 32.

In at least one embodiment, the second sealing member 40 includes a sealing body 41. The sealing body 41 includes a first surface 411, a second surface 412, a third surface 413, and an inclined surface 414. The first surface 411 connects to the second surface 412 and the third surface 413. The inclined surface 414 connects to the second surface 412 and the third surface 413. The second surface 412 and the third surface 413 are spaced from each other in the first direction X. The first surface 411 is connected to the first wall 311a, for example, by gluing. Viewed from a third direction Z, the sealing body 41 has a right-angle trapezoidal structure. The third direction Z is perpendicular to each of the first direction X and the second direction Y. When each of the first cover 31 and the second cover 32 covers the first opening 11, the pushing portion 321 abuts against and applies a pressing force onto the inclined surface 414. A portion of the pressing force from the pushing portion 321 compresses the second sealing member 40 in the first direction X, causing the sealing body 41 to deform in the first direction X. A remaining portion of the pressing force from the pushing portion 321 compresses the second sealing member 40 in the second direction Y, causing the sealing body 41 to deform in the second direction Y. Thus, the sealing body 41 can deform in different directions to improve the sealing effect.

Figure 6:
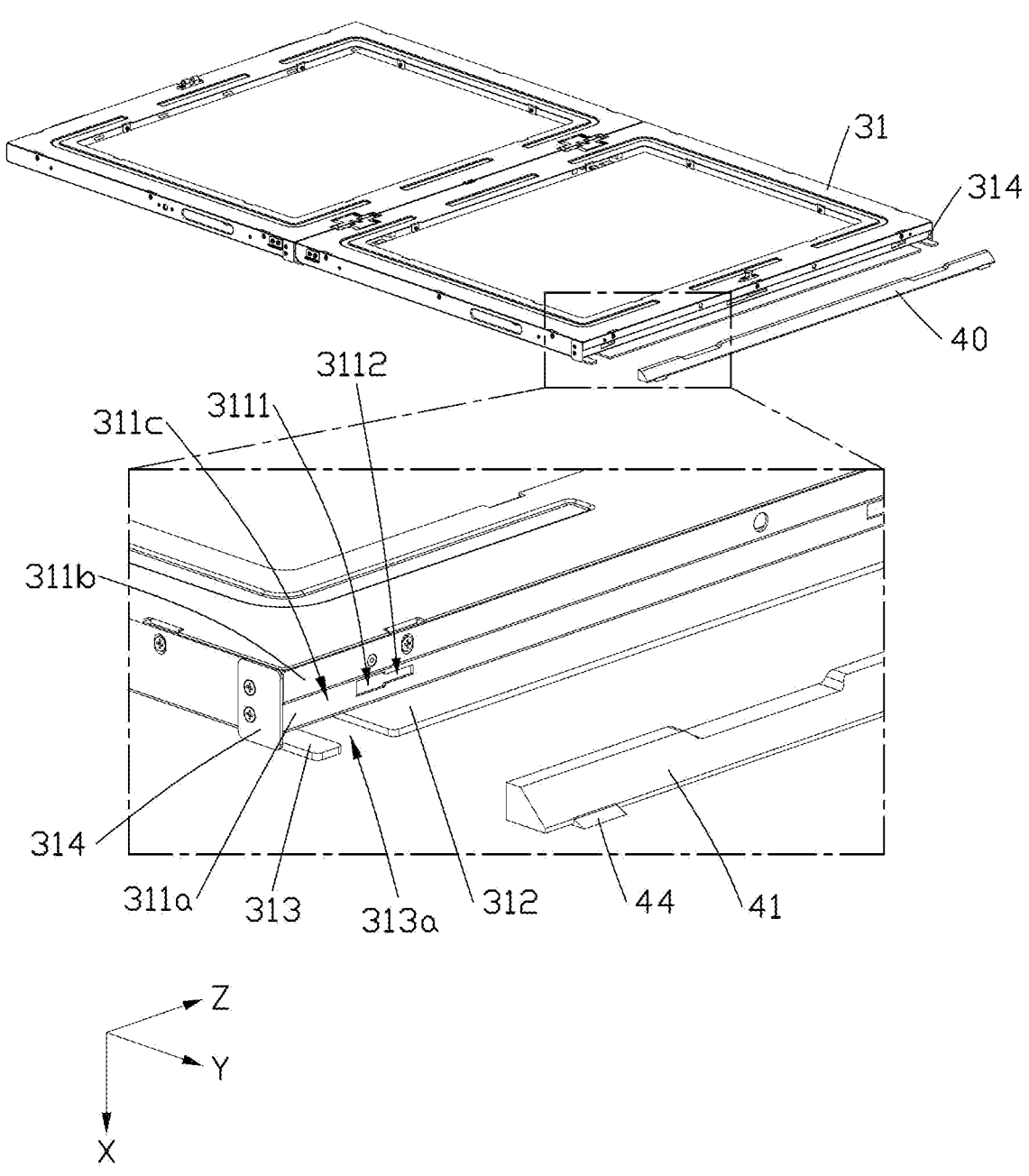
FIG. 6 is a diagrammatic view of a first cover and a second sealing member of the accommodating device in FIG. 1.

In at least one embodiment, the second sealing member 40 further includes a connecting portion 42 connected to the first surface 411. The connecting portion 42 is further connected to the first wall 311a. Referring to FIG. 6, the first wall 311a defines a second opening 3111 and a third opening 3112 arranged in the third direction Z. Each of the second opening 3111 and the third opening 3112 extends through the first wall 311a in the second direction Y. The second opening 3111 is connected to the third opening 3112. In the first direction X, a width of the second opening 3111 is greater than a width of the third opening 3112. A width of the connecting portion 42 is not greater than the width of the second opening 3111, and the width of the connecting portion 42 is greater than the width of the third opening 3112. As such, the connecting portion 42 can be clamped in the third opening 3112, so that the first surface 411 is connected to the first wall 311a. In operation, the connecting portion 42 can first located in the first main body 311 through the second opening 3111, and then moves to and clamped in the third opening 3112, thereby installing the second sealing member 40 to the first wall 311a. When each of the first cover 31 and the second cover 32 covers the first opening 11, the second sealing member 40 is compressed, and the first wall 311a and the second cover 32 limits the second sealing member 40 in the second direction Y. As such, the second sealing member 40 can be prevented from overflowing in the second direction Y, so that the sealing effect of the second sealing member 40 can be ensured.

Figure 7:
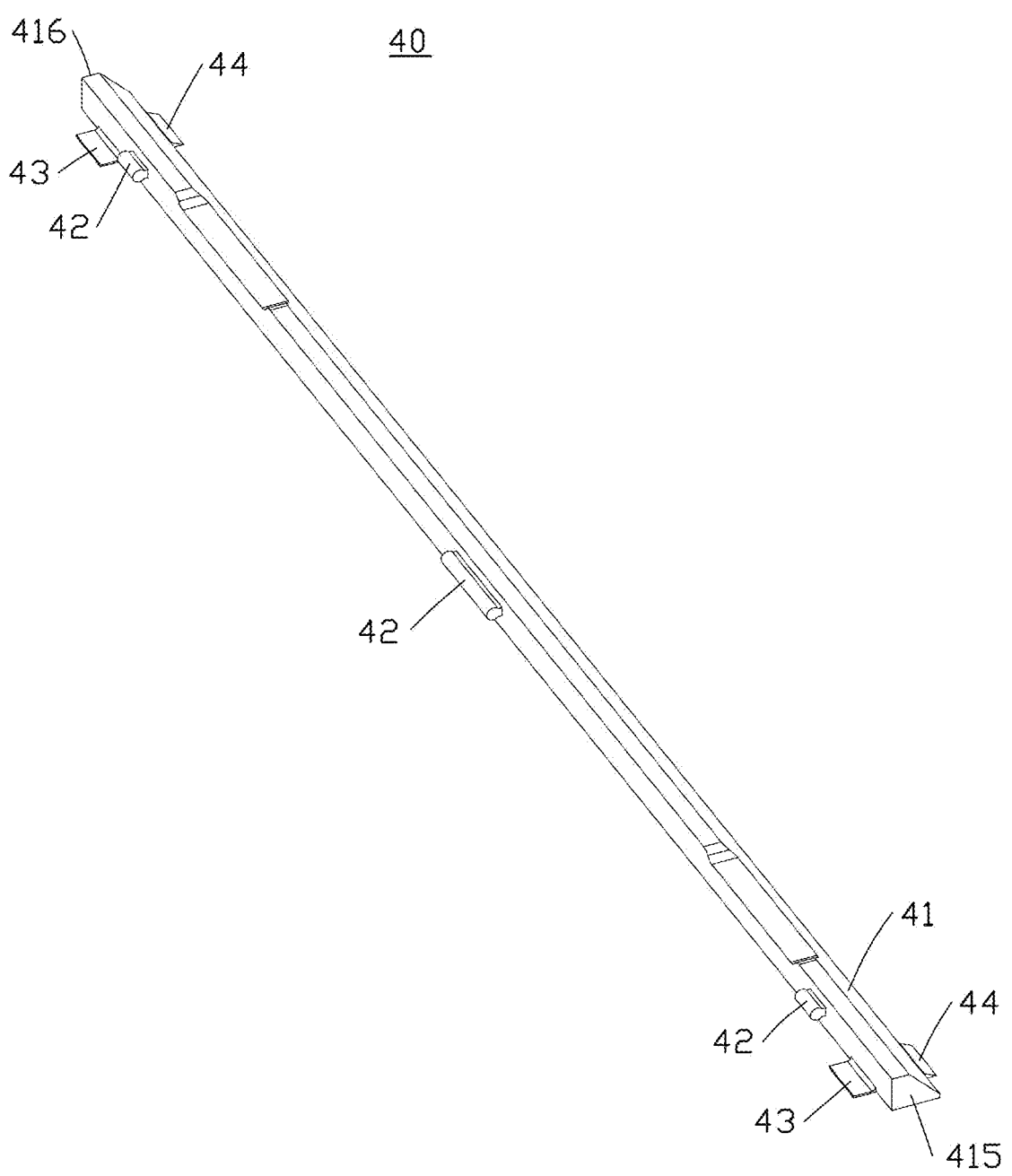
FIG. 7 is a diagrammatic view of the second sealing member of the accommodating device in FIG. 6.

Referring to FIG. 6, the first wall 311a may define multiple second openings 3111 and multiple third openings 3112 arranged in the third direction Z. Referring to FIG. 7, the second sealing member 40 may include multiple connecting portions 42. Each of the connecting portion 42 is clamped in a corresponding one of the third openings 3112, which can improve the connection strength between the second sealing member 40 and the first wall 311a.

Referring to FIGS. 5 and 6, in at least one embodiment, the first cover 31 further includes a first extending plate 312 connected to the first main body 311. The second wall 311b, the second sealing member 40, and the first extending plate 312 are sequentially arranged in the first direction X. The second wall 311b and the second surface 412 are spaced from each other in the first direction X, thereby defining a first space 140 between the second wall 311b and the second surface 412. The third surface 413 is in contact with the first extending plate 312. When each of the first cover 31 and the second cover 32 covers the first opening 11, the second sealing member 40 is compressed, and the second wall 311*b* and the first extending plate 312 limits the second sealing member 40 in the first direction X. As such, the second sealing member 40 can be prevented from overflowing in the first direction X, so the sealing effect of the second sealing member 40 can be ensured.

Figure 8:
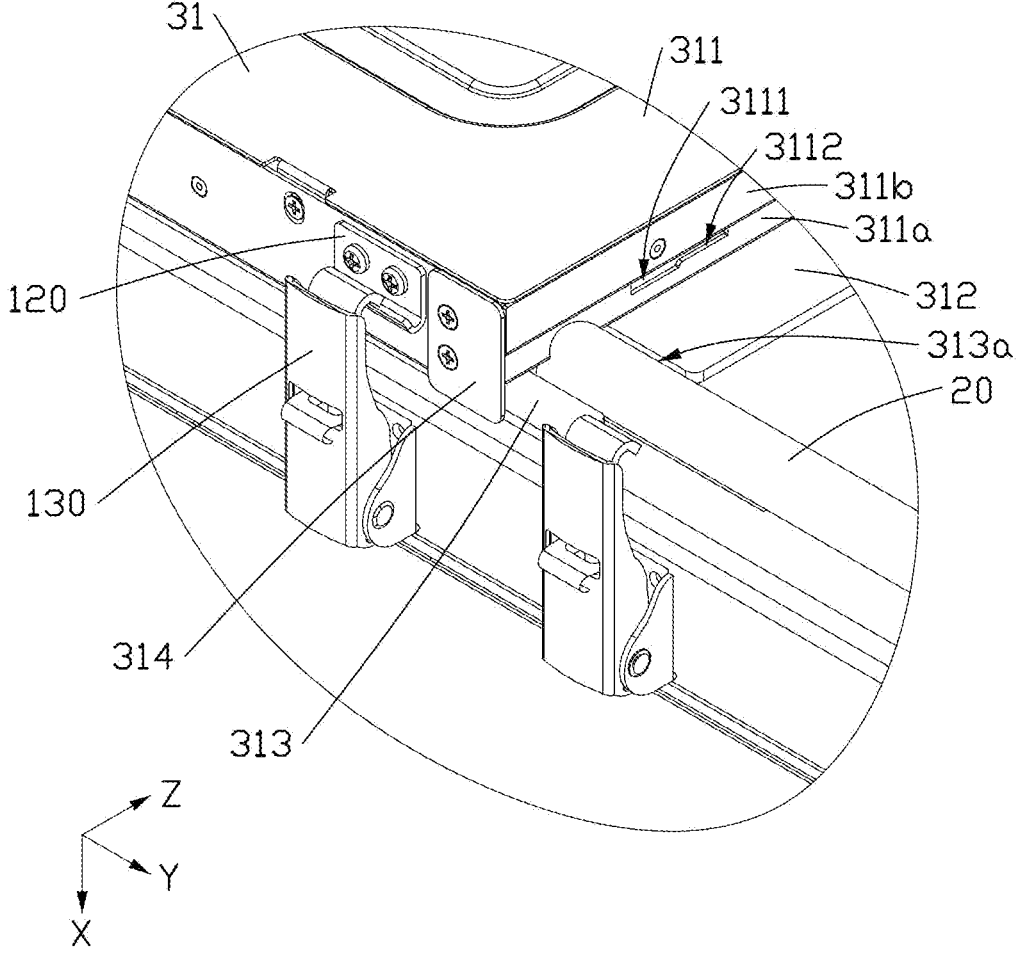
FIG. 8 is a diagrammatic view of another portion of the accommodating device in FIG. 1.

Referring to FIGS. 4 and 8, the first cover 31 further includes a second extending plate 313 connected to the first main body 311. The sealing body 41 is connected to the second extending plate 313. The second extending plate 313 and the first extending plate 312 are arranged in the third direction Z. A first gap 313*a* is defined between the second extending plate 313 and the first extending plate 312. When each of the first cover 31 and the second cover 32 covers the first opening 11, in the first direction X, a projection of the first sealing member 20 is located in a projection of the first gap 313*a*. The first sealing member 20 is connected to the second sealing member 40 through the first gap 313*a*, which can enhance the sealing effect between the first cover 31 and the second cover 32, thereby enhancing the sealing effect of the accommodating device 100. In at least one embodiment, the first sealing member 20 is in contact with the third surface 413 of the sealing body 41 through the first gap 313*a*.

In at least one embodiment, the first cover 31 may include two third extending plates 314 arranged in the third direction Z. The two third extending plates 314 are connected to two sides of the first main body 311 in the third direction Z. The second sealing member 40 is located between the two third extending plates 314. Referring to FIG. 7, the sealing body 41 includes a fourth surface 415 and a fifth surface 416 opposite to each other in the third direction Z. When the first cover 31 is connected to the second cover 32, the fourth surface 415 is in contact with one of the third extending plates 314, and the fifth surface 416 is in contact with another of the third extending plates 314. The two third extending plates 314 can limit the second sealing member 40 in the third direction Z. As such, the second sealing member 40 can be prevented from overflowing in the third direction Z, and the sealing effect of the second sealing member 40 can be ensured.

Figure 9:
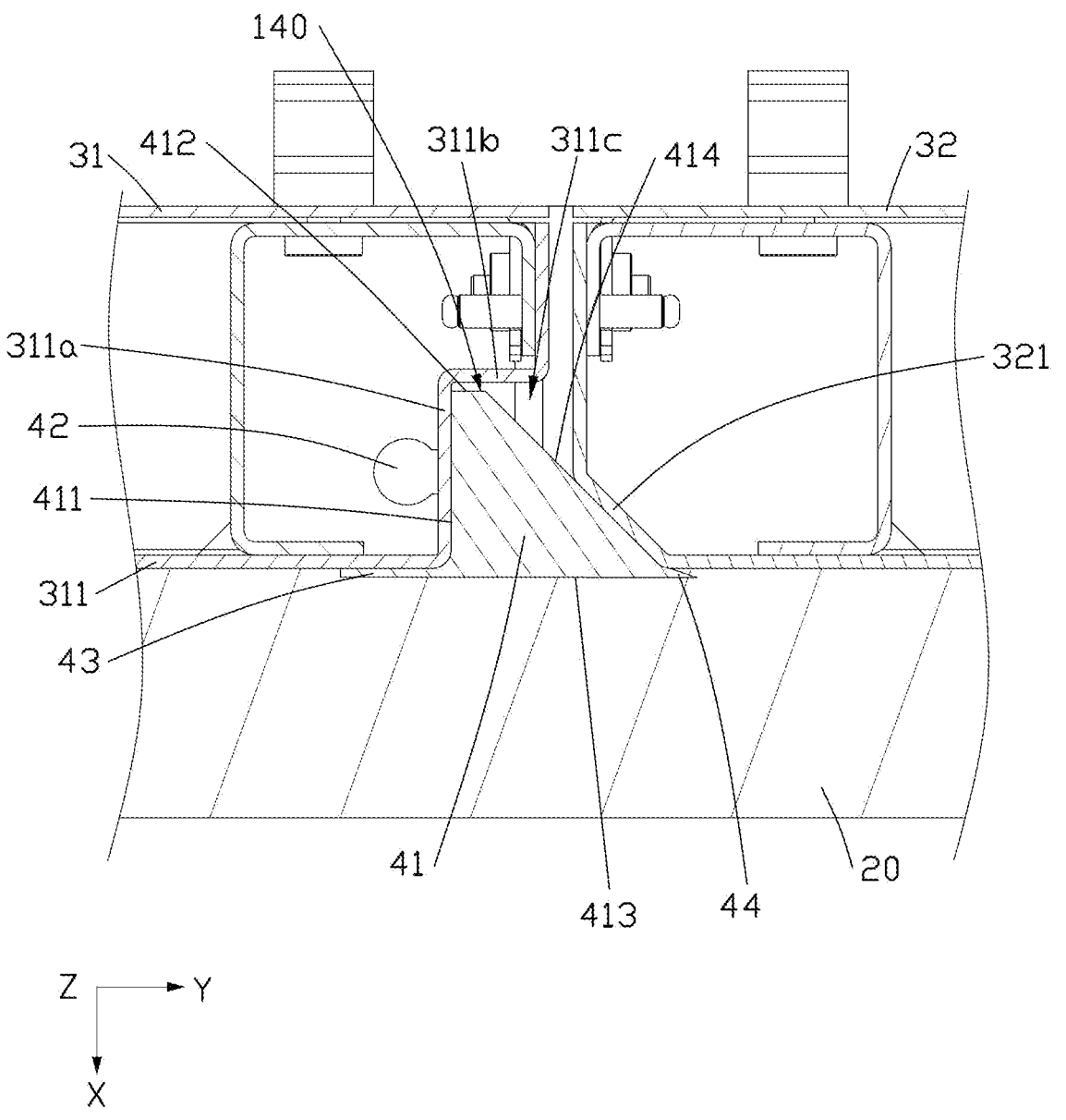
FIG. 9 is similar to FIG. 5 but illustrating the accommodating device according to another embodiment of the present application.
Figure 10:
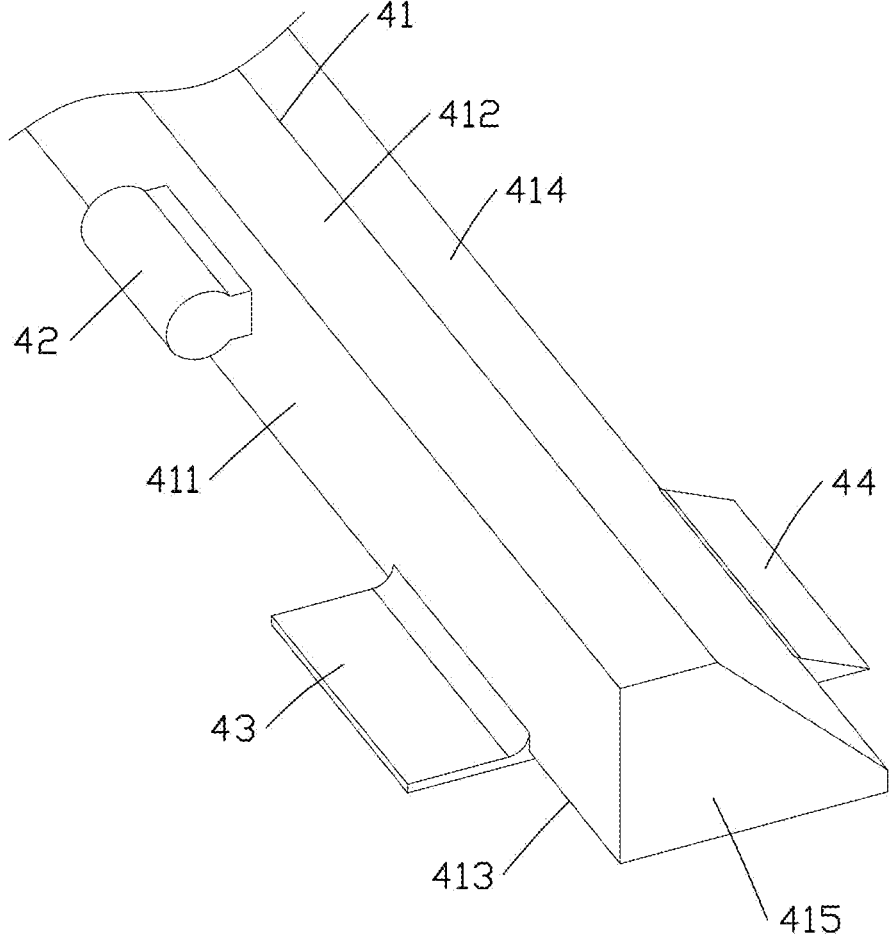
FIG. 10 is a diagrammatic view of the second sealing member in FIG. 9.

Referring to FIGS. 9 and 10, in another embodiment, the second sealing member 40 further includes a first extending portion 43 connected to the first surface 411. When each of the first cover 31 and the second cover 32 covers the first opening 11, the first extending portion 43 is located between the first main body 311 and the first sealing member 20, which can infill the gap between the first main body 311 and the first sealing member 20. As such, the sealing effect can be improved.

The second sealing member 40 may further include a second extending portion 44. The second extending portion 44 protrudes from the inclined surface 414 in the second direction Y. When each of the first cover 31 and the second cover 32 covers the first opening 11, the second extending portion 44 is located between the second cover 32 and the first sealing member 20, which can infill the gap between the second cover 32 and the first sealing member 20. As such, the sealing effect can be improved.

Referring to FIGS. 3A and 3B, in at least one embodiment, the first cover 31 includes multiple first cover bodies 31*a* arranged in the second direction Y. Each two adjacent first cover bodies 31*a* are rotatably connected to each other such as by a hinge. The second sealing member 40 is arranged between each two adjacent first cover bodies 31*a*.

An outermost one of the first cover bodies 31*a* in the second direction Y is rotatably connected to the first side 12, while another the other outermost one of the first cover bodies 31*a* in the second direction Y is adjacent to the second cover 32.

The second cover 32 includes multiple second cover bodies 32*a* arranged in the second direction Y. Each two adjacent second cover bodies 32*a* are rotatably connected to each other such as by a hinge. The second sealing member 40 is arranged between each two adjacent second cover bodies 32*a*. An outermost one of the second cover bodies 32*a* in the second direction Y is adjacent to the first cover body 31*a*, while another outermost one of the second cover bodies 32*a* in the second direction Y is rotatably connected to the second side 13.

When the first cover 31 includes the multiple first cover bodies 31*a*, the sealing structure between each two adjacent first cover bodies 31*a* is the same as the sealing structure between the first cover body 31*a* and the second cover body 32*a*. When the second cover 32 includes the multiple second cover bodies 32*a*, the sealing structure between each two adjacent second cover bodies 32*a* is the same as the sealing structure between the first cover body 31*a* and the second cover body 32*a*.

In operation, the first cover 31 or the second cover 32 can be selected to be opened according to actual needs. Since each of the first cover 31 and the second cover 32 is rotatably connected to the housing 10, so that at least one of the first cover 31 and the second cover 32 can be selected to be rotated to open the housing 10, thereby improving efficiency, facilitating the maintenance, and slowing down the speed of the medium that flowing out of the housing 10. After the housing 10 is closed, the first sealing member 20 seals the space between the cover assembly 30 and the housing 10, and the second sealing member 40 seals the space between the first cover 31 and the second cover 32. Thus, the sealing effect of the accommodating device 100 can be improved. Since the first sealing member 30 is partially in contact with the second sealing member 40, and the sealing effect of the accommodating device 100 can be further improved.

Figure 11:
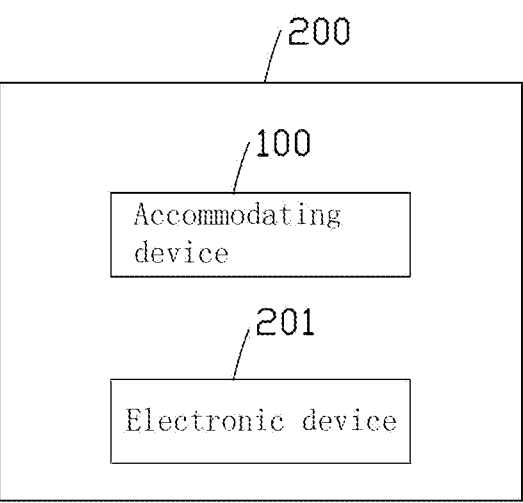
FIG. 11 is a diagrammatic view of a data processing system according to an embodiment of the present application.

Referring to FIG. 11, a data processing system 200 is provided according to an embodiment of the present application. The data processing system 200 includes the above accommodating device 100 and at least one electronic device 201 received in the accommodating device 100. The electronic device 201 may be a server.

Even though information and advantages of the present embodiments have been set forth in the foregoing description, together with details of the structures and functions of the present embodiments, the disclosure is illustrative only. Changes may be made in detail, especially in matters of shape, size, and arrangement of parts within the principles of the present exemplary embodiments, to the full extent indicated by the plain meaning of the terms in which the appended claims are expressed.

What is claimed is:

1. An accommodating device comprising:
a housing defining a first opening;
a cover assembly configured to cover the first opening, wherein the cover assembly and the housing are arranged in a first direction when the cover assembly covers the first opening, the cover assembly comprises a first cover and a second cover arranged in a second direction perpendicular to the first direction, the housing comprises a first side and a second side opposite to the first side in the second direction, the first cover is rotatably connected to the first side, the second cover is rotatably connected to the second side;

a first sealing member located between the cover assembly and the housing in the first direction, wherein when each of the first cover and the second cover covers the first opening, the first sealing member abuts against the housing and each of the first cover and the second cover in the first direction; and a second sealing member connected to the first cover or the second cover, wherein when each of the first cover and the second cover covers the first opening, the second sealing member abuts against the first cover and the second cover in the second direction;

wherein the first cover comprises a first main body and a first extending plate connected to the first main body, the first main body comprises a first wall and a second wall protruding from the first wall in the second direction, the second sealing member is connected to the first wall, and the second wall, the second sealing member, and the first extending plate are successively arranged in the first direction, and the second wall and the first extending plate are configured to limit the second sealing member in the first direction.

2. The accommodating device of claim 1, wherein an edge of the second cover close to the first cover comprises a pushing portion, the pushing portion is inclined relative to the first direction and the second direction, the second sealing member comprises an inclined surface, when each of the first cover and the second cover covers the first opening, the pushing portion is configured to apply a pressing force onto the inclined surface, and the pressing force is configured to compress the second sealing member in the first direction and the second direction.

3. The accommodating device of claim 1, wherein the first cover further comprises at least one second extending plate connected to the first main body, each of the at least one second extending plate and the first extending plate are arranged in a third direction, the third direction is perpendicular to each of the first direction and the second direction, a first gap is defined between each of the at least one second extending plate and the first extending plate, and in the first direction, a projection of the first sealing member is located within a projection of the first gap, and the first sealing member is connected to the second sealing member through the first gap.

4. The accommodating device of claim 3, wherein the first cover further comprises two third extending plates, the two third extending plates are connected to two sides of the first main body in the third direction, and the second sealing member is located between the two third extending plates in the third direction.

5. The accommodating device of claim 3, wherein the second sealing member comprises a first extending portion, and the first extending portion is located between the first sealing member and the first main body in the second direction.

6. The accommodating device of claim 5, wherein the second sealing member further comprises a second extending portion, and the second extending portion is located between the first sealing member and the second cover in the second direction.

7. The accommodating device of claim 3, wherein the first wall defines a second opening and a third opening connected to the second opening, the second sealing member comprises a connecting portion, in the first direction, a width of the second opening is greater than a width of the third opening, a width of the connecting portion is less than or equal to the width of the second opening and greater than the width of the third opening, the connecting portion is configured to slide to the third opening through the second opening, and is clamped in the third opening.

8. The accommodating device of claim 1, further comprising two buckles and two latches, wherein the two buckles are fixed to the first cover and the second cover, the two latches are fixed to the housing, and when each of the first cover and the second cover covers the first opening, the two latches are engaged with the two buckles.

9. The accommodating device of claim 1, wherein the first cover comprises a plurality of first cover bodies rotatably connected to each other, an outermost one of the plurality of first cover bodies in the second direction is rotatably connected to the first side, and the second sealing member is provided between adjacent two of the plurality of first cover bodies.

10. A data processing system comprising:
an electronic device; and
an accommodating device receiving the electronic device, the accommodating device comprising:
a housing defining a first opening;
a cover assembly configured to cover the first opening, wherein the cover assembly and the housing are arranged in a first direction when the cover assembly covers the first opening, the cover assembly comprises a first cover and a second cover arranged in a second direction perpendicular to the first direction, the housing comprises a first side and a second side opposite to the first side in the second direction, the first cover is rotatably connected to the first side, the second cover is rotatably connected to the second side;
a first sealing member located between the cover assembly and the housing in the first direction, wherein when each of the first cover and the second cover covers the first opening, the first sealing member abuts against the housing and each of the first cover and the second cover in the first direction; and
a second sealing member connected to the first cover or the second cover, wherein when each of the first cover and the second cover covers the first opening, the second sealing member abuts against the first cover and the second cover in the second direction;
wherein the first cover comprises a first main body and a first extending plate connected to the first main body, the first main body comprises a first wall and a second wall protruding from the first wall in the second direction, the second sealing member is connected to the first wall, and
the second wall, the second sealing member, and the first extending plate are successively arranged in the first direction, and the second wall and the first extending plate are configured to limit the second sealing member in the first direction.

11. The data processing system of claim 10, wherein an edge of the second cover close to the first cover comprises a pushing portion, the pushing portion is inclined relative to the first direction and the second direction, the second sealing member comprises an inclined surface, when each of the first cover and the second cover covers the first opening, the pushing portion is configured to apply a pressing force onto the inclined surface, and the pressing force is configured to compress the second sealing member in the first direction and the second direction.

12. The data processing system of claim 10, wherein the first cover further comprises at least one second extending plate connected to the first main body, each of the at least one second extending plate and the first extending plate are arranged in a third direction, the third direction is perpendicular to each of the first direction and the second direction, a first gap is defined between each of the at least one second extending plate and the first extending plate, and in the first direction, a projection of the first sealing member is located within a projection of the first gap, and the first sealing member is connected to the second sealing member through the first gap.

13. The data processing system of claim 12, wherein the first cover further comprises two third extending plates, the two third extending plates are connected to two sides of the first main body in the third direction, and the second sealing member is located between the two third extending plates in the third direction.

14. The data processing system of claim 12, wherein the second sealing member comprises a first extending portion, and the first extending portion is located between the first sealing member and the first main body in the second direction.

15. The data processing system of claim 14, wherein the second sealing member further comprises a second extending portion, and the second extending portion is located between the first sealing member and the second cover in the second direction.

16. The data processing system of claim 12, wherein the first wall defines a second opening and a third opening connected to the second opening, the second sealing member comprises a connecting portion, and in the first direction, a width of the second opening is greater than a width of the third opening, a width of the connecting portion is less than or equal to the width of the second opening and greater than the width of the third opening, the connecting portion is configured to slide to the third opening through the second opening, and is clamped in the third opening.

17. The data processing system of claim 10, wherein the accommodating device further comprises two buckles and two latches, the two buckles are fixed to the first cover and the second cover, the two latches are fixed to the housing, and when each of the first cover and the second cover covers the first opening, the two latches are engaged with the two buckles.

18. The data processing system of claim 10, wherein the first cover comprises a plurality of first cover bodies rotatably connected to each other, an outermost one of the plurality of first cover bodies in the second direction is rotatably connected to the first side, and the second sealing member is provided between adjacent two of the plurality of first cover bodies.

* * * * *